(12) United States Patent
Sato

(10) Patent No.: US 12,512,805 B2
(45) Date of Patent: Dec. 30, 2025

(54) BRANCHING FILTER

(71) Applicant: TDK CORPORATION, Tokyo (JP)

(72) Inventor: Takuya Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 145 days.

(21) Appl. No.: 18/541,010

(22) Filed: Dec. 15, 2023

(65) Prior Publication Data

US 2024/0283421 A1 Aug. 22, 2024

(30) Foreign Application Priority Data

Feb. 22, 2023 (JP) .................. 2023-025891

(51) Int. Cl.
*H03H 7/01* (2006.01)
*H01F 17/00* (2006.01)
*H03H 7/46* (2006.01)

(52) U.S. Cl.
CPC ....... *H03H 7/0115* (2013.01); *H01F 17/0013* (2013.01); *H03H 7/1775* (2013.01); *H03H 7/461* (2013.01); *H01F 2017/002* (2013.01); *H01F 2017/0026* (2013.01)

(58) Field of Classification Search
CPC ..... H03H 7/0115; H03H 7/461; H03H 7/1775
USPC ................................. 333/129, 132, 175, 185
See application file for complete search history.

(56) References Cited

U.S. PATENT DOCUMENTS

2014/0197902 A1    7/2014   Zuo et al.

*Primary Examiner* — Rakesh B Patel
(74) *Attorney, Agent, or Firm* — Oliff PLC

(57) ABSTRACT

A branching filter includes a first filter and a second filter. The first filter includes a first inductor. The second filter includes a second inductor. Each of the first inductor and the second inductor is wound about an axis extending in a direction orthogonal to a stacking direction of a stack. The first inductor is arranged at a position closer to a first end portion of the stack than to a second end portion of the stack. The second inductor is arranged at a position closer to the second end portion than to the first end portion.

12 Claims, 14 Drawing Sheets

BRANCHING FILTER

CROSS REFERENCE TO RELATED APPLICATIONS

This application claims the benefit of Japanese Priority Patent Application No. 2023-25891 filed on Feb. 22, 2023, the entire contents of which are incorporated herein by reference.

BACKGROUND OF THE INVENTION

1. Field of the Invention

The present invention relates to a branching filter for separating a plurality of signals of mutually different frequencies from each other.

2. Description of the Related Art

Compact mobile communication apparatuses are generally configured to use a single common antenna for a plurality of applications that use different systems and have different service frequency bands, and to use a branching filter to separate a plurality of signals received and transmitted by the antenna from each other.

A branching filter for separating a first signal of a frequency within a first frequency band and a second signal of a frequency within a second frequency band higher than the first frequency band from each other typically includes a common port, a first signal port, a second signal port, a first filter provided in a first signal path leading from the common port to the first signal port, and a second filter provided in a second signal path leading from the common port to the second signal port. As the first and second filters, LC filters including inductors and capacitors are used, for example.

As a branching filter suitable for miniaturization, one using a stack including a plurality of dielectric layers and a plurality of conductor layers stacked together is known. As an inductor used for a branching filter using a stack, a conductor structure type inductor is known. The conductor structure type inductor is an inductor including a conductor layer and a plurality of through holes and is wound about an axis orthogonal to a stacking direction of a plurality of dielectric layers. The conductor structure type inductor includes a columnar conductor constituted by a plurality of through holes connected in series.

The stack constituting the branching filter is formed as follows, for example. First, a plurality of ceramic green sheets, which eventually become a plurality of dielectric layers, are fabricated. Each ceramic green sheet has a plurality of unfired conductor layers formed thereon and a plurality of unfired through holes formed therein. The plurality of unfired conductor layers eventually become a plurality of conductor layers. The plurality of unfired through holes eventually become a plurality of through holes. Next, the plurality of ceramic green sheets are stacked together into a green sheet stack. The green sheet stack is then cut to form an unfired stack. The ceramic and conductor in the unfired stack are then fired by a low-temperature co-firing method to thereby complete the stack.

US 2014/0197902 A1 discloses a diplexer including a plurality of inductors each having a similar configuration as the conductor structure type inductor. Each of the plurality of inductors is wound multiple times about an axis extending in one direction.

For current mobile communication systems, a plurality of specifications using frequency bands relatively close to each other are present. Hence, a filter used for such a branching filter is required to abruptly change insertion loss in a frequency region near a passband.

As the first filter, a low-pass filter is used, for example. As an inductor forming an attenuation pole in a frequency region near the passband of the first filter and higher than the passband of the first filter in the pass attenuation characteristics of the first filter, a conductor structure type inductor can be used.

As the second filter, a band-pass filter or a high-pass filter is used, for example. To obtain characteristics of an abrupt change of insertion loss in a frequency region near the passband of the second filter and lower than the passband of the second filter in the second filter, an inductor connected, at both ends thereof, to a second signal path is added in some cases. This inductor forms an attenuation pole in the above frequency region.

In the process of manufacturing the branching filter, at the time of stacking the plurality of ceramic green sheets, the plurality of ceramic green sheets are slightly displaced in some cases. In this case, the characteristics of the inductor of the first filter and the characteristics of the inductor added to the second filter may change, which may consequently change the passband of the first filter and the passband of the second filter in some cases. In some modes of the changes of the passbands, signals supposed to be separated by the first and second filters cannot be separated in some cases.

SUMMARY OF THE INVENTION

An object of the present invention is to provide a branching filter that includes a first filter and a second filter and that can suppress a change in characteristics attributable to manufacturing variations while providing characteristics of an abrupt change of insertion loss in a frequency region near a passband of the second filter and lower than the passband of the second filter.

A branching filter of the present invention includes a common terminal, a first signal terminal, a second signal terminal, a first filter, which is provided between the common terminal and the first signal terminal in a circuit configuration, that selectively passes a signal of a frequency within a first passband, a second filter, which is provided between the common terminal and the second signal terminal in the circuit configuration, that selectively passes a signal within a second passband higher than the first passband, and a stack, which is for integrating the common terminal, the first signal terminal, the second signal terminal, the first filter, and the second filter, that includes a plurality of dielectric layers stacked together.

Each of the first filter and the second filter is an LC filter including at least one inductor and at least one capacitor. The first filter includes a first inductor connected, at both ends of the first inductor, to a first path connecting the common terminal and the first signal terminal. The second filter includes a second inductor connected, at both ends of the second inductor, to a second path connecting the common terminal and the second signal terminal. Each of the first inductor and the second inductor is wound about an axis extending in a direction orthogonal to a stacking direction of the plurality of dielectric layers.

The stack includes a first side surface and a second side surface located at respective both ends in a first direction orthogonal to the stacking direction, a third side surface and a fourth side surface located at respective both ends in a second direction orthogonal to the stacking direction and each connecting the first side surface and the second side surface, a first end portion located at a position where the first sides surface and the third side surface intersect, and a second end portion located at a position where the second side surface and the fourth end surface intersect. The first inductor is arranged at a position closer to the first end portion than to the second end portion. The second inductor is arranged at a position closer to the second end portion than to the first end portion.

A branching filter of the present invention includes a first filter and a second filter. The first filter includes a first inductor having the above-described characteristics, and the second filter includes the second inductor having the above-described characteristics. With this, according to the present invention, it is possible to suppress a change in characteristics attributable to manufacturing variation while providing characteristics of an abrupt change of insertion loss in a frequency region near the passband of the second filter and lower than the passband of the second filter.

Other and further objects, features and advantages of the present invention will appear more fully from the following description.

DETAILED DESCRIPTION OF THE PREFERRED EMBODIMENTS

Figure 1:
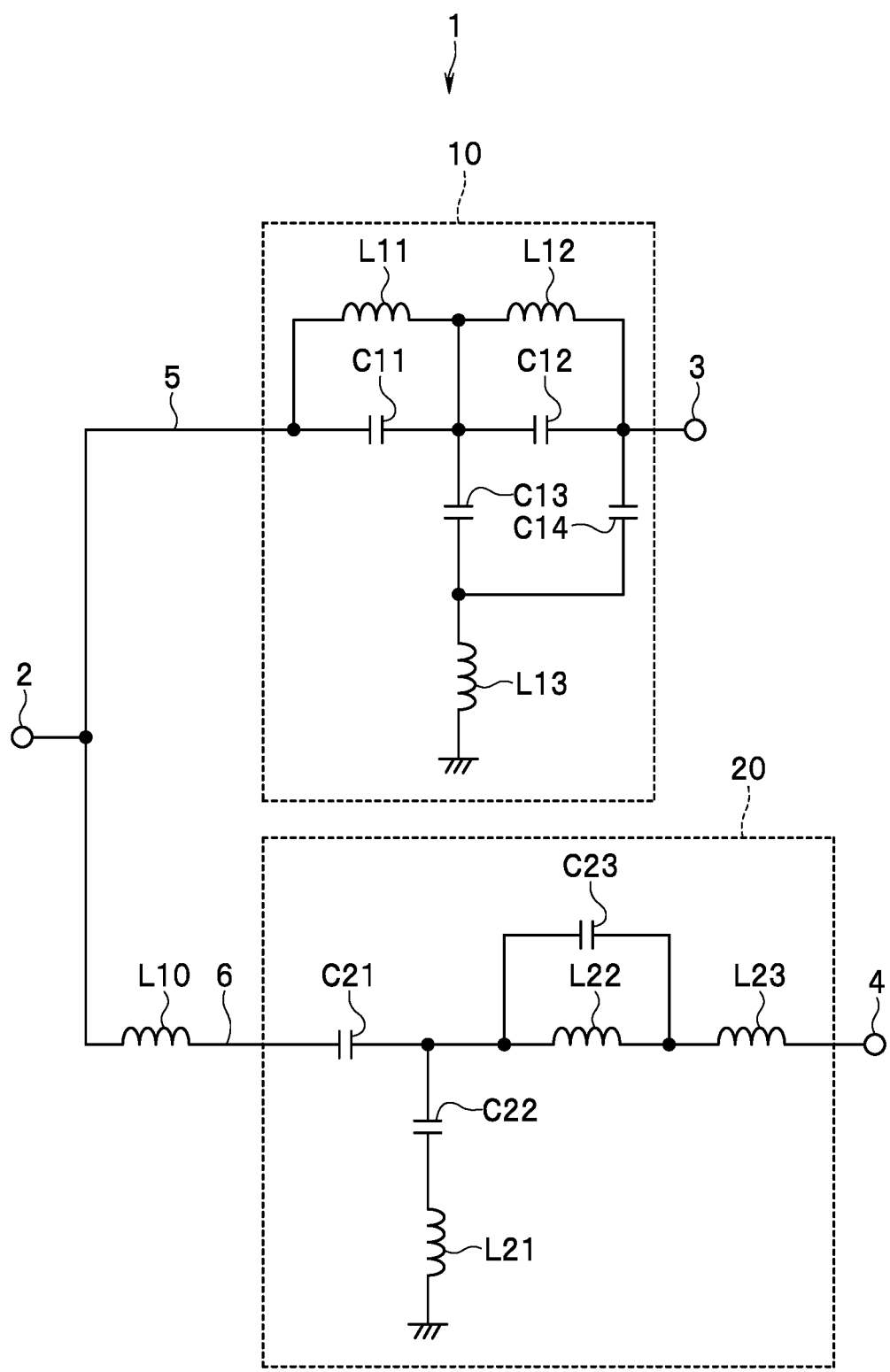
FIG. 1 is a circuit diagram showing a circuit configuration of a branching filter according to one embodiment of the present invention.

An embodiment of the present invention will now be described in detail with reference to the drawings. First, a configuration of a branching filter 1 according to the embodiment of the present invention will be outlined with reference to FIG. 1. FIG. 1 is a circuit diagram showing a circuit configuration of the branching filter 1. The branching filter 1 according to the present embodiment is a diplexer. The branching filter 1 includes a common terminal 2, a first signal terminal 3, a second signal terminal 4, a first filter 10, and a second filter 20.

The first filter 10 is provided between the common terminal 2 and the first signal terminal 3 in a circuit configuration. The second filter 20 is provided between the common terminal 2 and the second signal terminal 4 in the circuit configuration. In the present application, the expression of "in the (a) circuit configuration" is used to indicate not layout in physical configuration but layout in the circuit diagram.

The first filter 10 is a filter that selectively passes a signal of a frequency within a first passband and is an LC filter including at least one inductor and at least one capacitor. The second filter 20 is a filter that selectively passes a signal within a second passband higher than the first passband and is an LC filter including at least one inductor and at least one capacitor.

The branching filter 1 further includes a first path 5 connecting the common terminal 2 and the first signal terminal 3, and a second path 6 connecting the common terminal 2 and the second signal terminal 4. The first path 5 is a path leading from the common terminal 2 to the first signal terminal 3 via the first filter 10. The second path 6 is a path leading from the common terminal 2 to the second signal terminal 4 via the second filter 20. The first path 5 and the second path 6 branch between the common terminal 2 and the first and second filters 10 and 20.

The first filter 10 includes a first inductor connected, at both ends thereof, to the first path 5. The second filter 20 includes a second inductor connected, at both ends thereof, to the second path 6, and a third inductor provided between the second path 6 and the ground.

The branching filter 1 further includes an inductor L10 provided between the common terminal 2 and the second filter 20 in the circuit configuration. One end of the inductor L10 is connected to the common terminal 2.

Next, an example of configurations of the first and second filters 10 and 20 will be described with reference to FIG. 1. Initially, the configuration of the first filter 10 will be described. The first filter 10 includes inductors L11, L12, and L13 and capacitors C11, C12, C13, and C14. One end of the inductor L11 is connected to the common terminal 2. One end of the inductor L12 is connected to the other end of the inductor L11. The other end of the inductor L12 is connected to the first signal terminal 3.

The capacitor C11 is connected in parallel with the inductor L11. The capacitor C12 is connected in parallel with the inductor L12.

One end of the capacitor C13 is connected to a connection point between the inductor L11 and the inductor L12. One end of the capacitor C14 is connected to the other end of the inductor L12. One end of the inductor L13 is connected to the other ends of the capacitors C13 and C14. The other end of the inductor L13 is connected to the ground.

The inductor L12 is connected, at both ends thereof, to the first path 5. The inductor L12 corresponds to the first inductor. The inductor L12 may form part of the first path 5.

Next, the configuration of the second filter 20 will be described. The second filter 20 includes inductors L21, L22, and L23 and capacitors C21, C22, and C23. One end of the capacitor C21 is connected to the other end of the inductor L10. One end of the capacitor C22 is connected to the other end of the capacitor C21. One end of the inductor L21 is connected to the other end of the capacitor C22. The other end of the inductor L21 is connected to the ground.

One end of the inductor L22 is connected to the other end of the capacitor C21. One end of the inductor L23 is connected to the other end of the inductor L22. The other end of the inductor L23 is connected to the second signal terminal 4. The capacitor C23 is connected in parallel with the inductor L22.

The inductor L22 is connected, at both ends thereof, to the second path 6. The inductor L22 corresponds to the second inductor. The inductor L22 may form part of the second path 6.

The inductor L21 is provided between the second path 6 and the ground. The inductor L21 corresponds to the third inductor.

Figure 2:
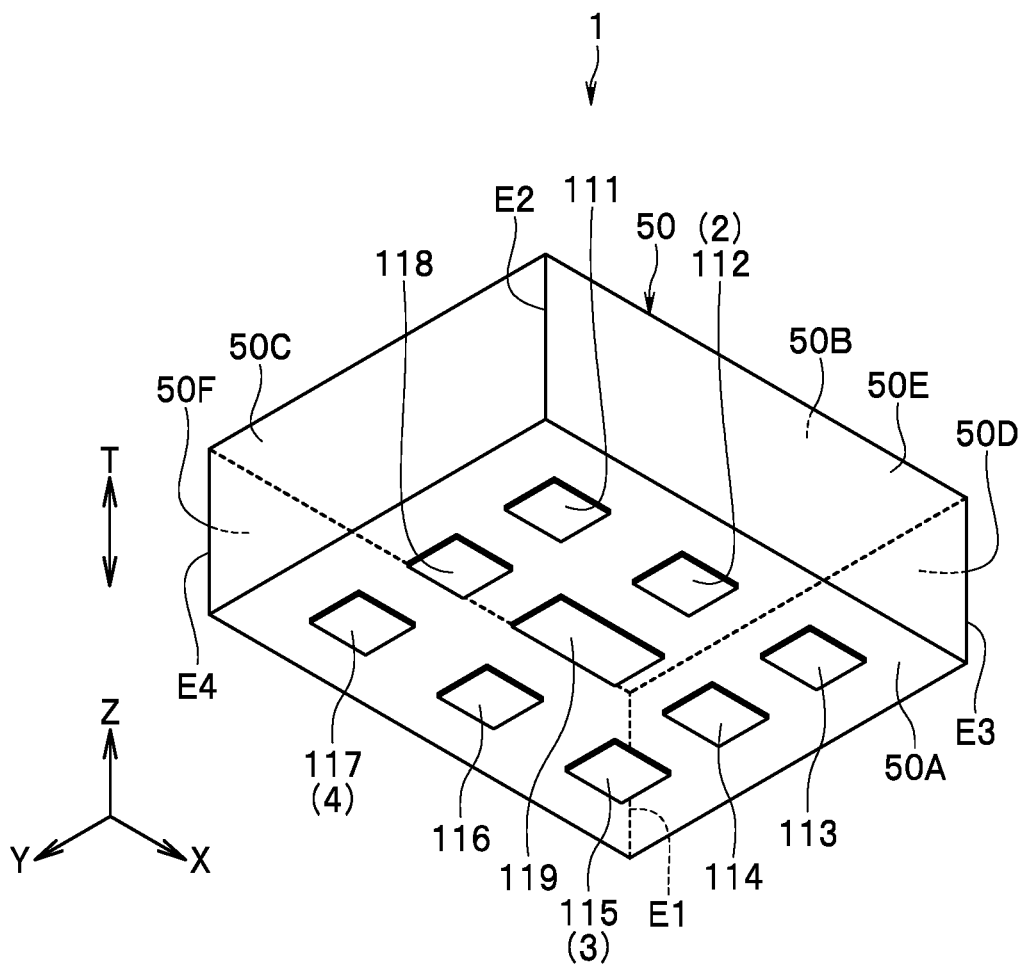
FIG. 2 is a perspective view showing an appearance of the branching filter according to the embodiment of the present invention.

Next, other configurations of the branching filter 1 will be described with reference to FIG. 2. FIG. 2 is a perspective view showing an appearance of the branching filter 1.

The branching filter 1 further includes a stack 50. The stack 50 includes a plurality of dielectric layers and a plurality of conductors (a plurality of conductor layers and a plurality of through holes) stacked together. The stack 50 is for integrating the common terminal 2, the first signal terminal 3, the second signal terminal 4, the first filter 10, and the second filter 20.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other, and the side surfaces 50E and 50F are also opposite to each other. The side surfaces 50C to 50F are perpendicular to the top surface 50B and the bottom surface 50A.

Here, X, Y, and Z directions are defined as shown in FIG. 2. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively. The expression "when viewed in the stacking direction T" means that an object is viewed from a position away in the Z direction or the −Z direction.

As shown in FIG. 2, the bottom surface 50A is located at the end of the stack 50 in the −Z direction. The top surface 50B is located at the end of the stack 50 in the Z direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

Each of the side surfaces 50E and 50F connects the side surfaces 50C and the side surface 50D. The stack 50 further has a first end portion E1 located at a position where the side surface 50D and the side surface 50F intersect, a second end portion E2 located at a position where the side surface 50C and the side surface 50E intersect, a third end portion E3 located at a position where the side surface 50D and the side surface 50E intersect, and a fourth end portion E4 located at a position where the side surface 50C and the side surface 50F intersect.

The branching filter 1 further includes electrodes 111, 112, 113, 114, 115, 116, 117, 118, and 119 provided at the bottom surface 50A of the stack 50. The electrodes 111, 112, and 113 are arranged in this order in the X direction at positions closer to the side surface 50E than to the side surface 50F. The electrodes 115, 116, and 117 are arranged in this order in the −X direction at positions closer to the side surface 50F than to the side surface 50E.

The electrode 114 is arranged between the electrode 113 and the electrode 115. The electrode 118 is arranged between the electrode 111 and the electrode 117. The electrode 119 is arranged between the electrode 112 and the electrode 116. The electrode 119 is arranged approximately at the center of the bottom surface 50A.

The electrode 112 corresponds to the common terminal 2, the electrode 115 corresponds to the first signal terminal 3, and the electrode 117 corresponds to the second signal terminal 4. The common terminal 2 and the first and second signal terminals 3 and 4 are thus provided to the bottom surface 50A of the stack 50. Each of the electrodes 111, 113, 114, 116, 118, and 119 is connected to the ground.

Next, an example of the plurality of dielectric layers, the plurality of conductor layers, and the plurality of through holes constituting the stack 50 will be described with reference to FIG. 3A to FIG. 8B. In this example, the stack 50 includes twenty-three dielectric layers stacked together. The twenty-three dielectric layers will be referred to as first to twenty-third dielectric layers in the order from bottom to top below. The first to twenty-third dielectric layers are denoted by reference numerals 51 to 73, respectively.

In FIG. 3A to FIG. 8A, each circle represents a through hole. The dielectric layers 51 to 72 each have a plurality of through holes. The through holes are each formed by filling a hole intended for a through hole with a conductive paste. Each of the plurality of through holes is connected to an electrode, a conductor layer, or another through hole.

In FIG. 4A to FIG. 7C, a plurality of specific through holes forming a plurality of columnar conductors to be described below among the plurality of through holes are denoted by reference numerals. For a connection relationship between each of the plurality of specific through holes and the conductor layers or another through hole, the connection relationship in a state where the first to twenty-third dielectric layers 51 to 73 are stacked together will be described. Each of the plurality of specific through holes is denoted by the reference numeral of a corresponding columnar conductor.

Figure 3A:
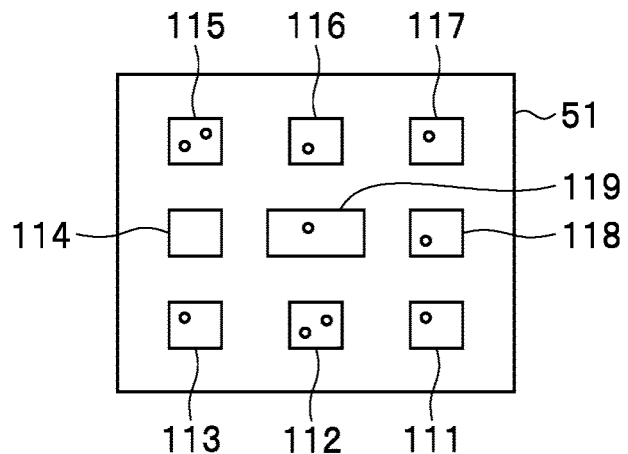
FIG. 3A to FIG. 3C are explanatory diagrams showing respective patterned surfaces of first to third dielectric layers of a stack of the branching filter according to the embodiment of the present invention.
Figure 3B:
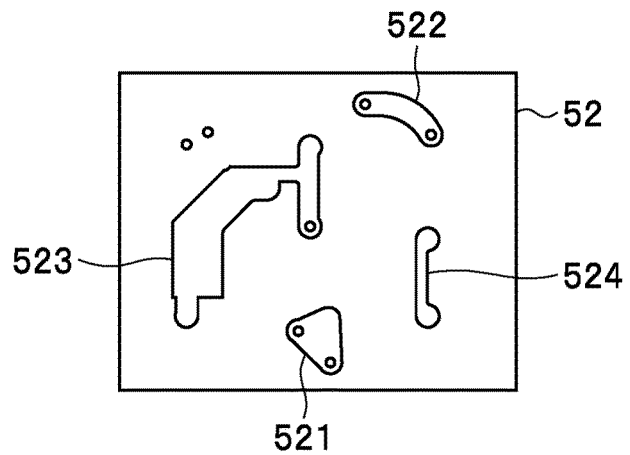
Figure 3C:
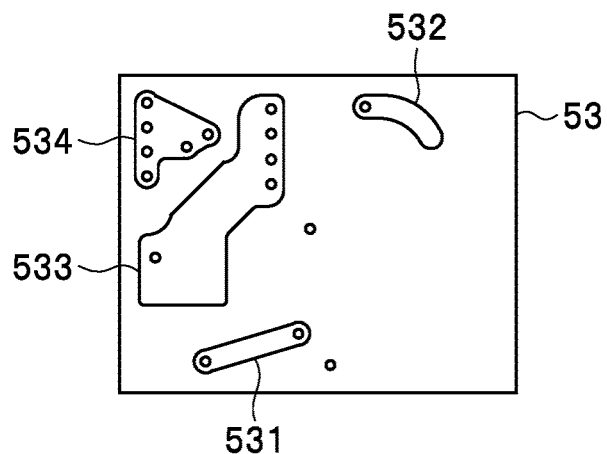

FIG. 3A shows the patterned surface of the first dielectric layer 51. The electrodes 111 to 119 are formed on the patterned surface of the dielectric layer 51. FIG. 3B shows the patterned surface of the second dielectric layer 52. Conductor layers 521, 523, and 524 and an inductor conductor layer 522 are formed on the patterned surface of the dielectric layer 52. FIG. 3C shows the patterned surface of the third dielectric layer 53. Inductor conductor layers 531 and 532 and conductor layers 533 and 534 are formed on the patterned surface of the dielectric layer 53.

Figure 4A:
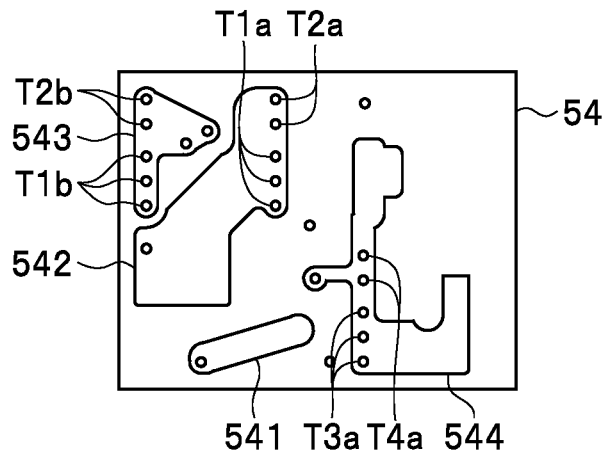
FIG. 4A to FIG. 4C are explanatory diagrams showing respective patterned surfaces of fourth to sixth dielectric layers of the stack of the branching filter according to the embodiment of the present invention.

FIG. 4A shows the patterned surface of the fourth dielectric layer 54. An inductor conductor layer 541 and conductor layers 542, 543, and 544 are formed on the patterned surface of the dielectric layer 54. Three through holes denoted by a reference numeral T1$a$, three through holes denoted by a reference numeral T1$b$, two through holes denoted by a reference numeral T2$a$, two through holes denoted by a reference numeral T2$b$, three through holes denoted by a reference numeral T3$a$, and two through holes denoted by a reference numeral T4$a$ are formed in the dielectric layer 54.

The three through holes denoted by the reference numeral T1$a$ are through holes for forming three columnar conductors T1$a$. Note that a through hole denoted by the reference numeral T1$a$ is described as a through hole T1$a$ in the following description for convenience. Through holes denoted by reference numerals other than the through hole T1$a$ are described similarly to the through hole T1$a$. The through holes denoted by reference numerals other than the through hole T1$a$ are each a through hole for forming a columnar conductor denoted by the reference numeral.

The three through holes T1$a$ formed in the dielectric layer 54 and the three through holes T2$a$ formed in the dielectric layer 54 are connected to the conductor layer 542. The three through holes T1$b$ formed in the dielectric layer 54 and the two through holes T2$b$ formed in the dielectric layer 54 are connected to the conductor layer 543. The three through holes T3$a$ formed in the dielectric layer 54 and the two through holes T4$a$ formed in the dielectric layer 54 are connected to the conductor layer 544.

Figure 4B:
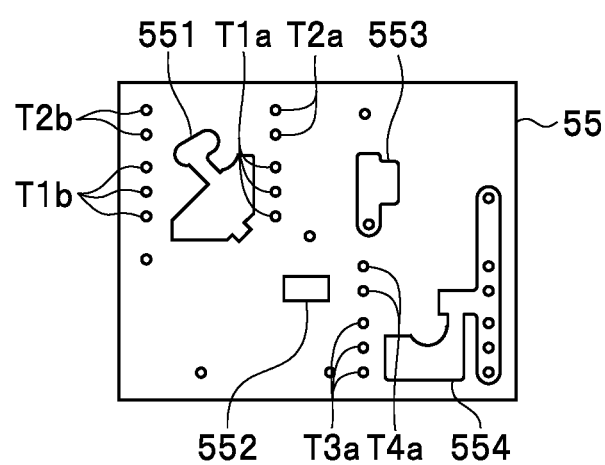

FIG. 4B shows the patterned surface of the fifth dielectric layer 55. Conductor layers 551, 552, 553, and 554 are formed on the patterned surface of the dielectric layer 55. The three through holes T1$a$, the three through holes T1$b$, the two through holes T2$a$, the two through holes T2$b$, the three through holes T3$a$, and the two through holes T4$a$ are formed in the dielectric layer 55.

Figure 4C:
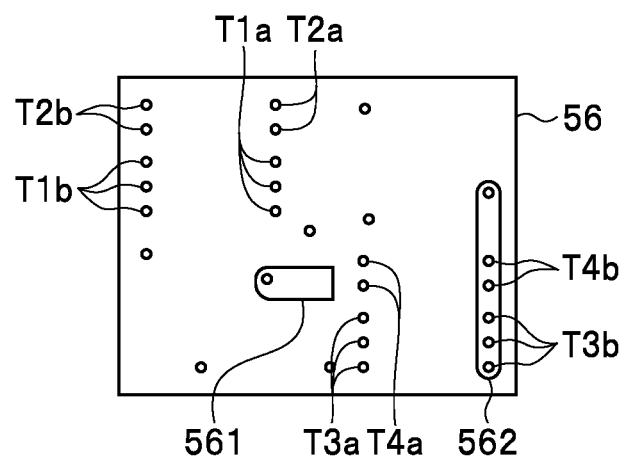

FIG. 4C shows the patterned surface of the sixth dielectric layer 56. Conductor layers 561 and 562 are formed on the patterned surface of the dielectric layer 56. The three through holes T1$a$, the three through holes T1$b$, the two through holes T2$a$, the two through holes T2$b$, the three through holes T3$a$, the three through holes T3$b$, the two through holes T4$a$, and the two through holes T4$b$ are formed in the dielectric layer 56. The three through holes T3$b$ formed in the dielectric layer 56 and the two through holes T4$b$ formed in the dielectric layer 56 are connected to the conductor layer 562.

Figure 5A:
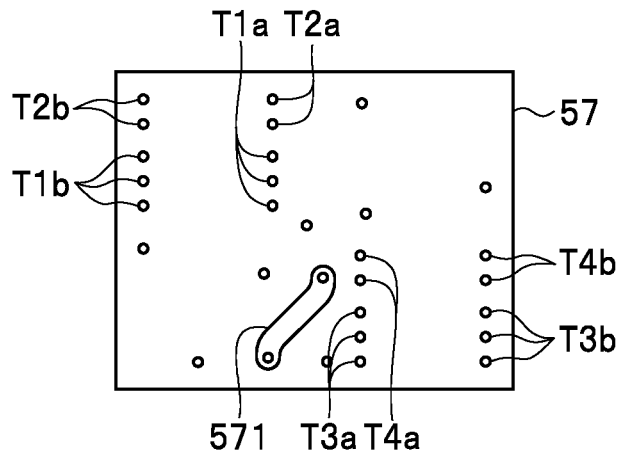
FIG. 5A to FIG. 5C are explanatory diagrams showing respective patterned surfaces of seventh to ninth dielectric layers of the stack of the branching filter according to the embodiment of the present invention.
Figure 5B:
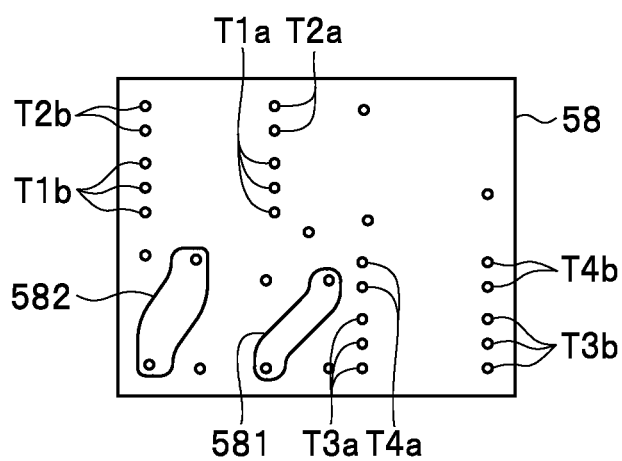
Figure 5C:
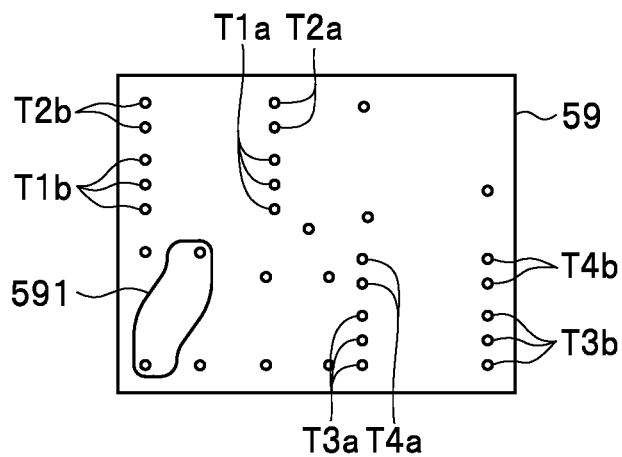

FIG. 5A shows the patterned surface of the seventh dielectric layer 57. An inductor conductor layer 571 is formed on the patterned surface of the dielectric layer 57. FIG. 5B shows the patterned surface of the eighth dielectric layer 58. Inductor conductor layers 581 and 582 are formed on the patterned surface of the dielectric layer 58. FIG. 5C shows the patterned surface of the ninth dielectric layer 59. An inductor conductor layer 591 is formed on the patterned surface of the dielectric layer 59.

Figure 6A:
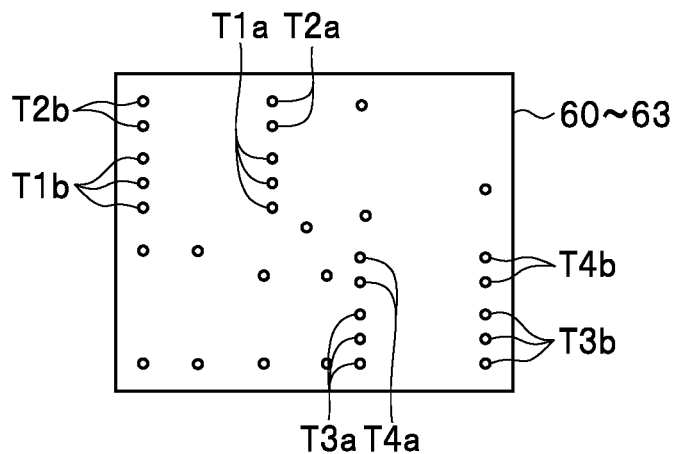
FIG. 6A is an explanatory diagram showing a patterned surface of tenth to thirteenth dielectric layers of the stack of the branching filter according to the embodiment of the present invention.
Figure 6B:
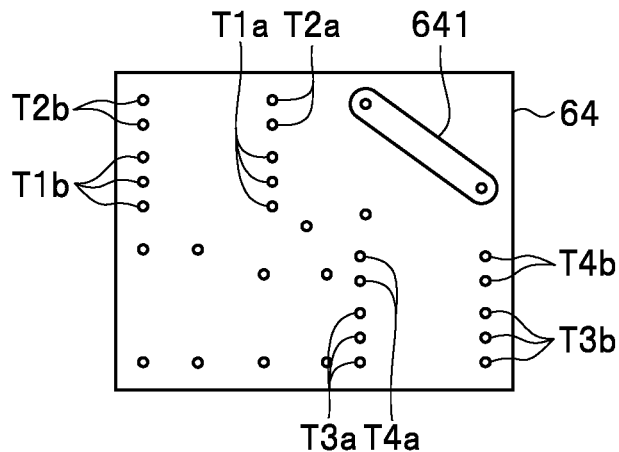
FIG. 6B is an explanatory diagram showing a patterned surface of a fourteenth dielectric layer of the stack of the branching filter according to the embodiment of the present invention.
Figure 6C:
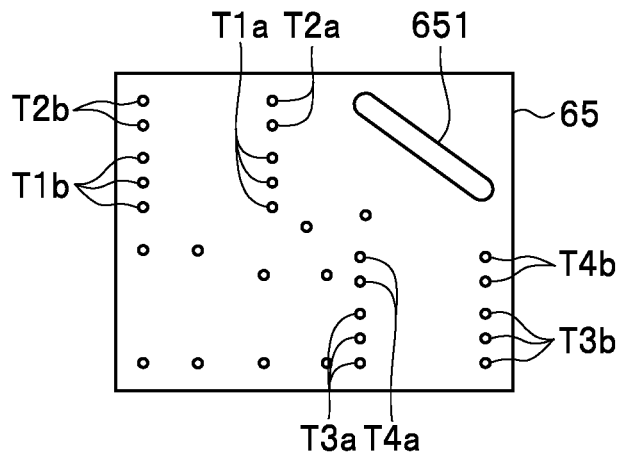
FIG. 6C is an explanatory diagram showing a patterned surface of a fifteenth dielectric layer of the stack of the branching filter according to the embodiment of the present invention.

FIG. 6A shows the patterned surface of each of the tenth to thirteenth dielectric layers 60 to 63. No conductor layer is formed on the patterned surface of each of the dielectric layers 60 to 63. FIG. 6B shows the patterned surface of the fourteenth dielectric layer 64. An inductor conductor layer 641 is formed on the patterned surface of the dielectric layer 64. FIG. 6C shows the patterned surface of the fifteenth dielectric layer 65. An inductor conductor layer 651 is formed on the patterned surface of the dielectric layer 65.

Figure 7A:
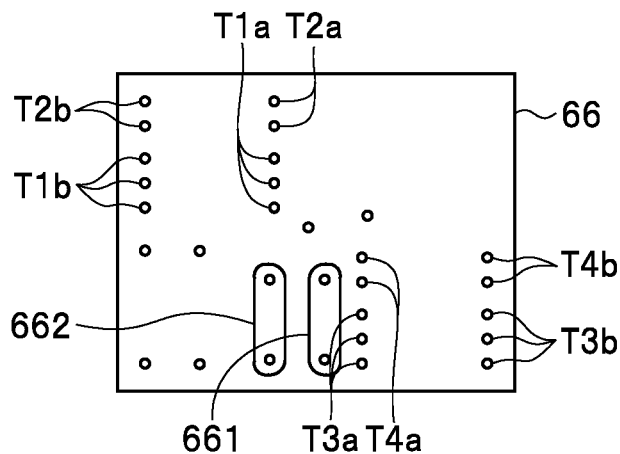
FIG. 7A is an explanatory diagram showing a patterned surface of a sixteenth dielectric layer of the stack of the branching filter according to the embodiment of the present invention.
Figure 7B:
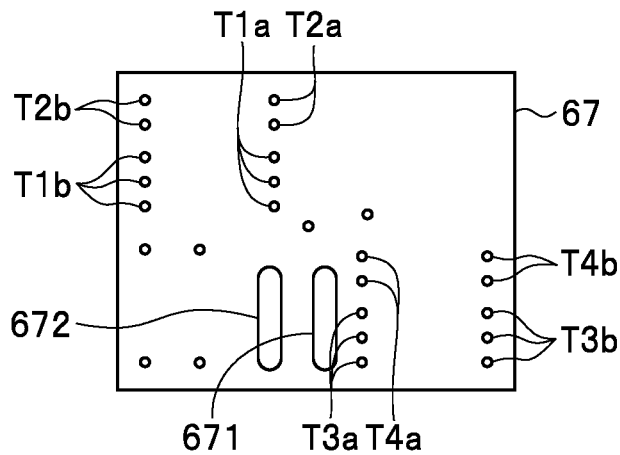
FIG. 7B is an explanatory diagram showing a patterned surface of a seventeenth dielectric layer of the stack of the branching filter according to the embodiment of the present invention.
Figure 7C:
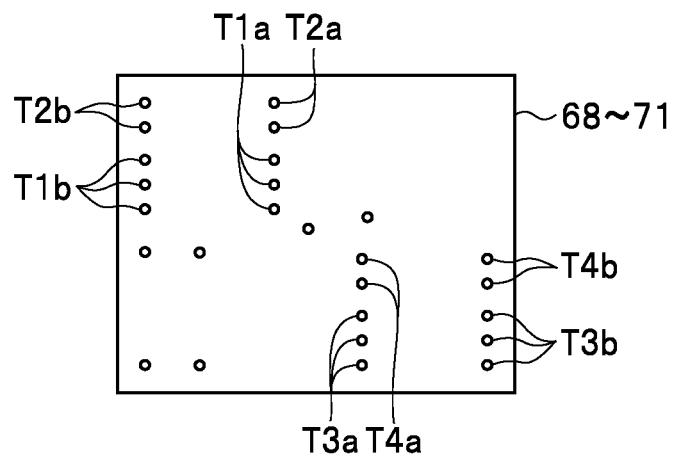
FIG. 7C is an explanatory diagram showing a patterned surface of eighteenth to twenty-first dielectric layers of the stack of the branching filter according to the embodiment of the present invention.

FIG. 7A shows the patterned surface of the sixteenth dielectric layer 66. Inductor conductor layers 661 and 662 are formed on the patterned surface of the dielectric layer 66. FIG. 7B shows the patterned surface of the seventeenth dielectric layer 67. Inductor conductor layers 671 and 672 are formed on the patterned surface of the dielectric layer 67. FIG. 7C shows the patterned surface of each of the eighteenth to twenty-first dielectric layers 68 to 71. No conductor layer is formed on the patterned surface of each of the dielectric layers 68 to 71.

The three through holes T1$a$, the three through holes T1$b$, the two through holes T2$a$, the two through holes T2$b$, the three through holes T3$a$, the three through holes T3$b$, the two through holes T4$a$, and the two through holes T4$b$ are formed in each of the dielectric layers 57 to 71.

Figure 8A:
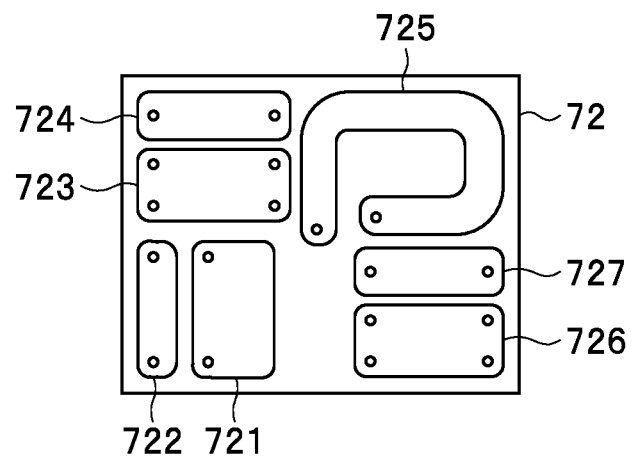
FIG. 8A and FIG. 8B are explanatory diagrams showing respective patterned surfaces of twenty-second and twenty-third dielectric layers of the stack of the branching filter according to the embodiment of the present invention.

FIG. 8A shows the patterned surface of the twenty-second dielectric layer 72. Inductor conductor layers 721, 722, 723, 724, 725, 726, and 727 are formed on the patterned surface of the dielectric layer 72. Each of the conductor layers 723, 724, 726, and 727 has a first end and a second end located opposite to each other.

The three through holes T1$a$ formed in the dielectric layer 71 are connected to a part near the first end of the conductor layer 723. The three through holes T1$b$ formed in the dielectric layer 71 are connected to a part near the second end of the conductor layer 723.

The two through holes T2$a$ formed in the dielectric layer 71 are connected to a part near the first end of the conductor layer 724. The two through holes T2$b$ formed in the dielectric layer 71 are connected to a part near the second end of the conductor layer 724.

The three through holes T3$a$ formed in the dielectric layer 71 are connected to a part near the first end of the conductor layer 726. The three through holes T3$b$ formed in the dielectric layer 71 are connected to a part near the second end of the conductor layer 726.

The two through holes T4$a$ formed in the dielectric layer 71 are connected to a part near the first end of the conductor layer 727. The two through holes T4$b$ formed in the dielectric layer 71 are connected to a part near the second end of the conductor layer 727.

Figure 8B:
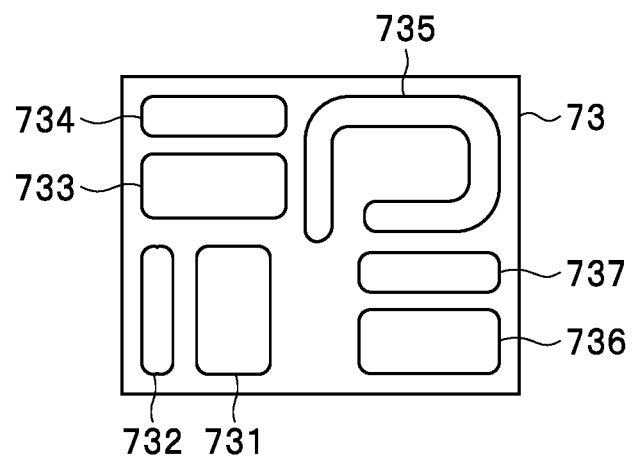

FIG. 8B shows the patterned surface of the twenty-third dielectric layer 73. Inductor conductor layers 731, 732, 733, 734, 735, 736, and 737 are formed on the patterned surface of the dielectric layer 73.

The stack 50 shown in FIG. 2 is formed by stacking the first to twenty-third dielectric layers 51 to 73 such that the patterned surface of the first dielectric layer 51 serves as the bottom surface 50A of the stack 50 and the surface of the twenty-third dielectric layer 73 opposite to the patterned surface thereof serves as the top surface 50B of the stack 50.

Each of the plurality of through holes shown in FIG. 3A to FIG. 8A is connected to, when the first to twenty-third dielectric layers 51 to 73 are stacked, a conductor layer overlapping in the stacking direction T or to another through hole overlapping in the stacking direction T. Of the plurality of through holes shown in FIG. 3A to FIG. 8A, the ones located within an electrode or a conductor layer are connected to the electrode or conductor layer.

Figure 9:
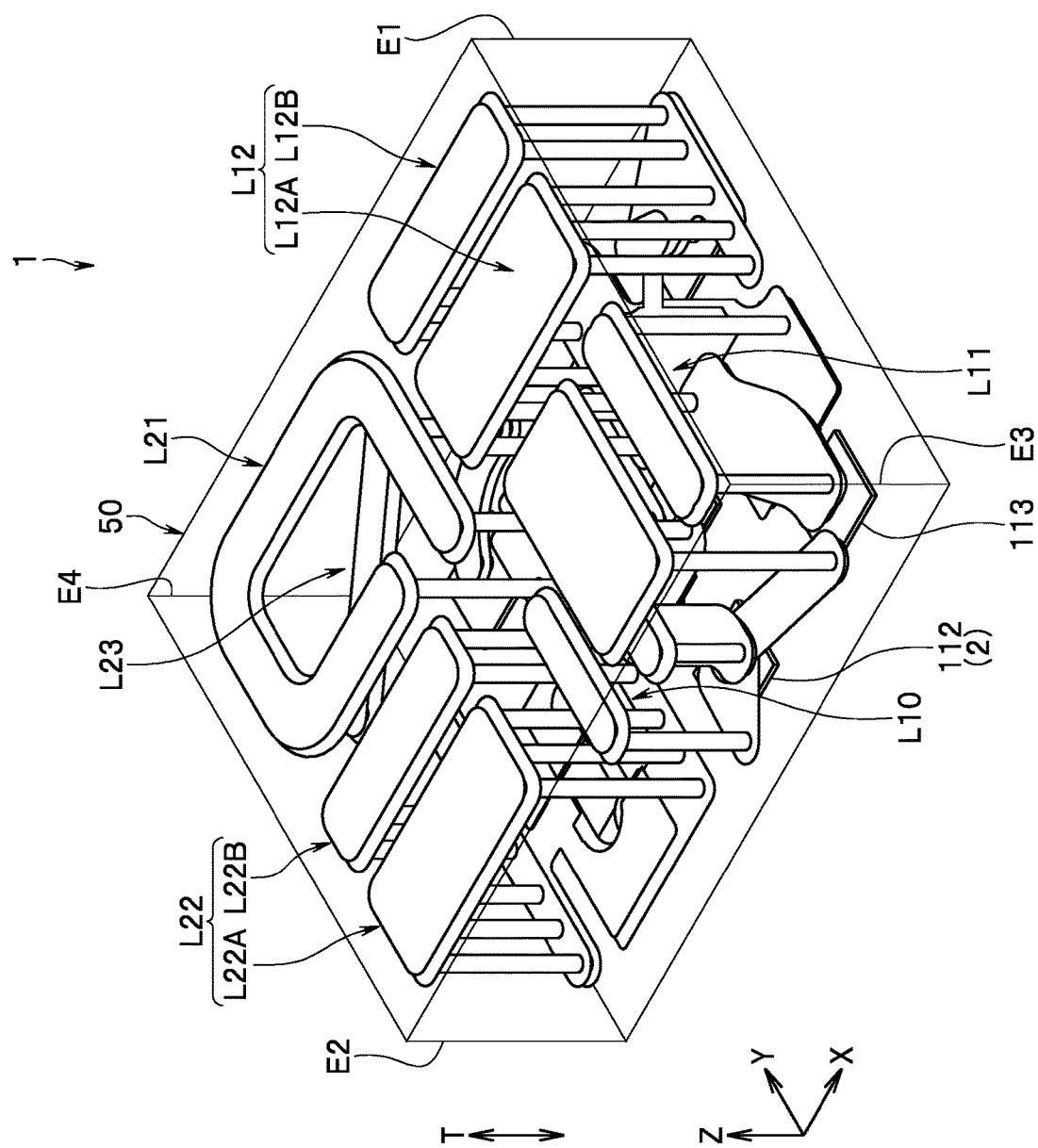
FIG. 9 is a perspective view showing an internal structure of the stack of the branching filter according to the embodiment of the present invention.

FIG. 9 shows an internal structure of the stack 50 formed by stacking the first to twenty-third dielectric layers 51 to 73. As shown in FIG. 9, the plurality of conductor layers and the plurality of through holes shown in FIG. 3A to 8B are stacked inside the stack 50.

Correspondences between the components of the circuit of the branching filter 1 shown in FIG. 1 and the internal components of the stack 50 shown in FIG. 3A to FIG. 8B will now be described. First, the inductor L10 will be described. The inductor L10 is constituted by inductor conductor layers 571, 581, 661, 662, 671, and 672, a plurality of through holes connecting each of a pair of conductor layers 571 and 581, a pair of conductor layers 661 and 671, and a pair of conductor layers 662 and 672, a plurality of through holes connecting the conductor layer 581 and the conductor layer 661, a plurality of through holes connecting the conductor layer 581 and the conductor layer 662, a plurality of through holes connecting the conductor layer 661 and the conductor layer 521, and a plurality of through holes connecting the conductor layer 662 and the conductor layer 561.

Next, the components of the first filter 10 will be described. The inductor L11 is constituted by inductor conductor layers 582, 591, 721, 722, 731, and 732, a plurality of through holes connecting each of a pair of conductor layers 582 and 591, a pair of conductor layers 721 and 731, and a pair of conductor layers 722 and 732, a plurality of through holes connecting the conductor layer 591 and the conductor layer 721, a plurality of through holes connecting the conductor layer 591 and the conductor layer 722, a plurality of through holes connecting the conductor layer 721 and the conductor layer 541, and a plurality of through holes connecting the conductor layer 722 and the conductor layer 542.

The inductor L12 is constituted by the inductor conductor layers 723, 724, 733, and 734, a plurality of through holes connecting each of a pair of conductor layers 723 and 733 and a pair of conductor layers 724 and 734, and the plurality of through holes denoted by the reference numerals T1a, T1b, T2a, and T2b.

The inductor L13 is constituted by a through hole connecting the electrode 116 and the conductor layer 523 and a through hole connecting the electrode 119 and the conductor layer 523.

The capacitor C11 is the sum of floating capacitance generated between the conductor layer 721 and the conductor layer 722 and floating capacitance generated between the conductor layer 731 and the conductor layer 732. The capacitor C12 is constituted by the conductor layers 542 and 551 and the dielectric layer 54 interposed between those conductor layers. The capacitor C13 is constituted by the conductor layers 523 and 533 and the dielectric layer 52 interposed between those conductor layers. The capacitor C14 is floating capacitance generated between the electrode 114 and the electrode 115, the conductor layer 534, or the conductor layer 543.

Next, the components of the second filter 20 will be described. The inductor L21 is constituted by the inductor conductor layers 725 and 735 and a plurality of through holes connecting the conductor layer 725 and the conductor layer 735.

The inductor L22 is constituted by the inductor conductor layers 726, 727, 736, and 737, a plurality of through holes connecting each of a pair of conductor layers 726 and 736 and a pair of conductor layers 727 and 737, and the plurality of through holes denoted by the reference numerals T3a, T3b, T4a, and T4b.

The inductor L23 is constituted by inductor conductor layers 522, 532, 641, and 651, a plurality of through holes connecting each of a pair of conductor layers 522 and 532 and a pair of conductor layers 641 and 651, a plurality of through holes connecting the conductor layer 532 and the conductor layer 641, and a plurality of through holes connecting the conductor layer 641 and the conductor layer 562.

The capacitor C21 is constituted by the conductor layers 552 and 561 and the dielectric layer 55 interposed between those conductor layers. The capacitor C22 is constituted by the conductor layers 544 and 553 and the dielectric layer 54 interposed between those conductor layers. The capacitor C23 is constituted by the conductor layers 544 and 554 and the dielectric layer 54 interposed between those conductor layers.

Figure 10:
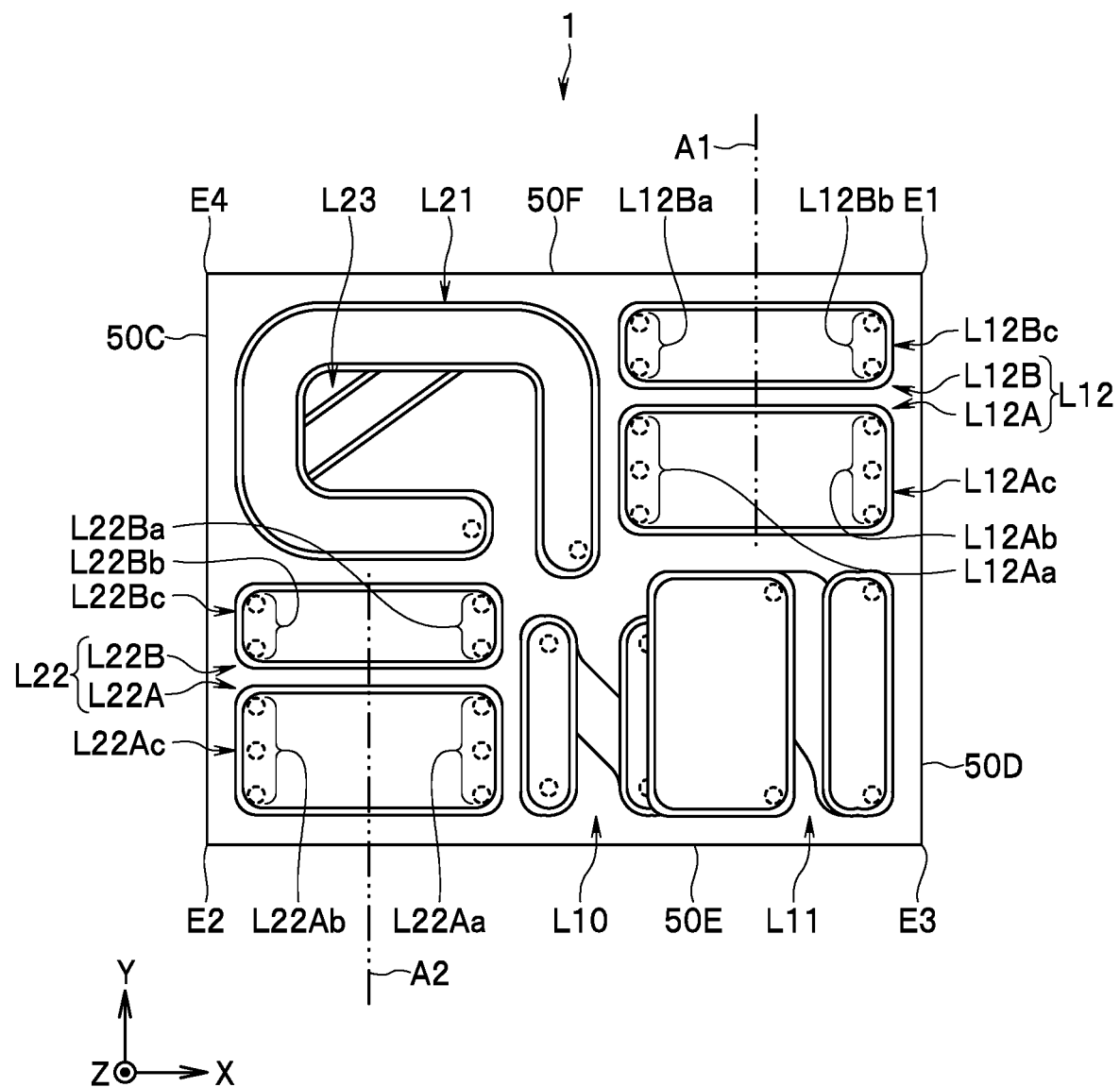
FIG. 10 is a plan view showing part of the internal structure of the stack of the branching filter according to the embodiment of the present invention.
Figure 11:
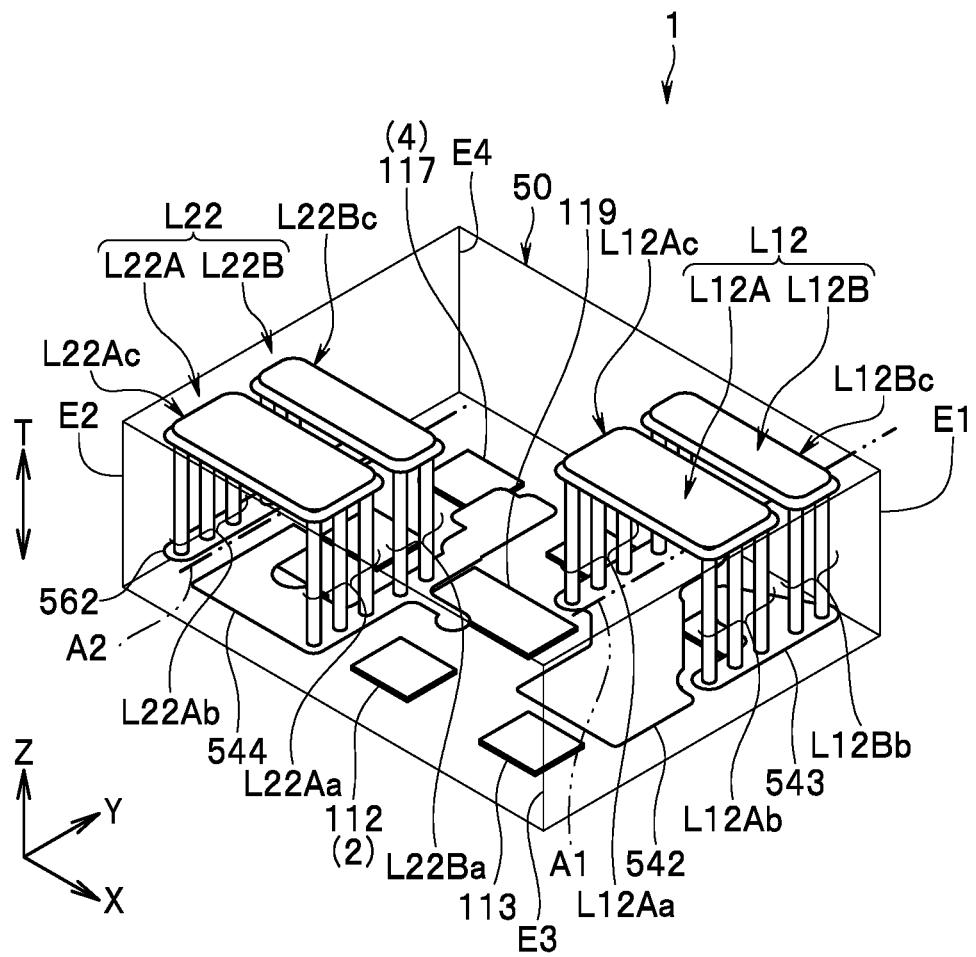
FIG. 11 is a perspective view showing part of the internal structure of the stack of the branching filter according to the embodiment of the present invention.
Figure 12:
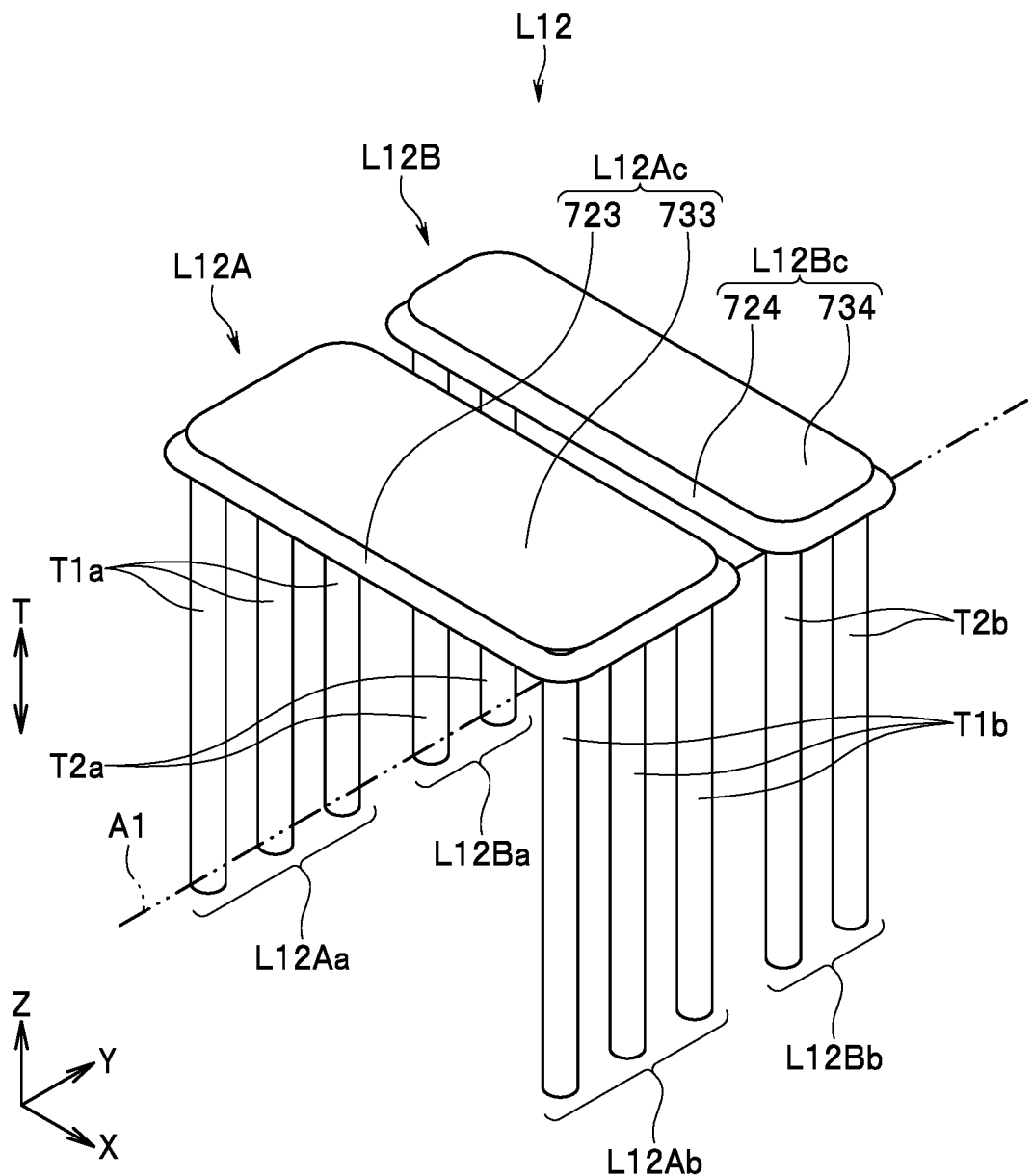
FIG. 12 is a perspective view showing a first inductor of the embodiment of the present invention.
Figure 13:
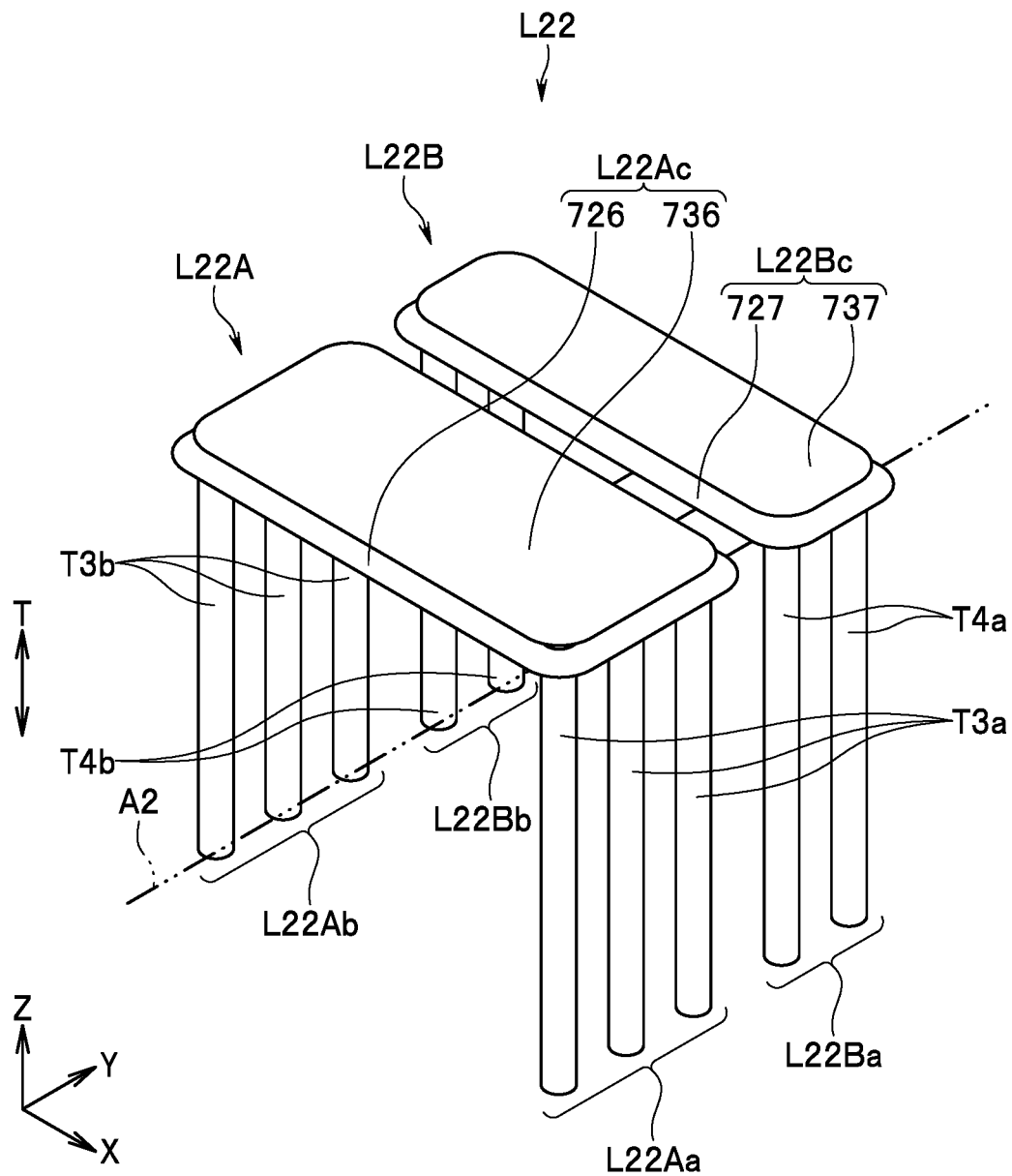
FIG. 13 is a perspective view showing a second inductor of the embodiment of the present invention.

Next, structural features of the branching filter 1 according to the present embodiment will be described with reference to FIG. 2 to FIG. 13. FIG. 10 is a plan view showing a part of the internal structure of the stack 50 shown in FIG. 9. FIG. 11 is a perspective view showing a part of the internal structure of the stack 50 shown in FIG. 9. FIG. 12 is a perspective view showing the first inductor, in other words, the inductor L12. FIG. 13 is a perspective view showing the second inductor, in other words, the inductor L22.

As shown in FIG. 10 to FIG. 13, each of the inductors L12 and L22 is wound about an axis extending in a direction orthogonal to the stacking direction T. In particular, in the present embodiment, the inductor L12 is a conductor structure type inductor wound about a first axis A1. The inductor L22 is a conductor structure type inductor wound about a second axis A2. The first axis A1 and the second axis A2 may be parallel to each other. In the examples shown in FIG. 10 to FIG. 13, each of the first axis A1 and the second axis A2 extends in a direction parallel to the Y axis.

As shown in FIG. 9 to FIG. 11, the inductor L12 is arranged at a position closer to a first end portion E1 of the stack 50 than to a second end portion E2 of the stack 50. Further, the inductor L12 is preferably arranged at a position closer to the first end portion E1 of the stack 50 than to third and fourth end portions E3 and E4 of the stack 50. The inductor L22 is arranged at a position closer to the second end portion E2 of the stack 50 than to the first end portion E1 of the stack 50. Further, the inductor L22 is preferably arranged at a position closer to the second end portion E2 of the stack 50 than to the third and fourth end portions E3 and E4 of the stack 50.

In particular, in the present embodiment, the inductors L12 and L22 are arranged to intersect a virtual straight line (diagonal line) linking the first end portion E1 and the second end portion E2 when viewed in the stacking direction T. In particular, in the present embodiment, the inductors L12 and L22 are arranged so as not to overlap each other when viewed in the Y direction. Further, the inductors L12 and L22 may be arranged so as not to overlap each other when viewed in the X direction.

In the examples shown in FIG. 9 and FIG. 10, no other element is arranged each of between the inductor L12 and the side surface 50D and between the inductor L12 and the side surface 50F. However, as long as the above requirements related to arrangement of the inductor L12 are satisfied, any other element may be arranged between the inductor L12 and the side surface 50D or the side surface 50F. Similarly, in the examples shown in FIG. 9 and FIG. 10, no other element is arranged each of between the inductor L22 and the side surface 50C and between the inductor L22 and the side surface 50E. However, as long as the above requirements related to arrangement of the inductor L22 are satisfied, any other element may be arranged between the inductor L22 and the side surface 50C or the side surface 50E.

Each of the inductors L12 and L22 includes a first structure and a second structure each extending in a direction parallel to the stacking direction T and a third structure extending along a plane intersecting the stacking direction T and provided between the first structure and the second structure in the circuit configuration. The first to third structures will be described in detail below.

First, the first to third structures of the inductor L12 will be described. As shown in FIG. 9 to FIG. 12, the inductor L12 includes a first inductor portion L12A, and a second inductor portion L12B connected in parallel with the first inductor portion L12A. Each of the first and second inductor portions L12A and L12B includes a conductor structure wound about the first axis A1.

The conductor structure of the first inductor portion L12A is also a rectangular or approximately rectangular winding. For the rectangular or approximately rectangular winding, the number of windings may be counted, when the winding is regarded as a rectangle, as ¼ per side of the rectangle. The number of windings of the conductor structure of the first inductor portion L12A is ¾.

The conductor structure of the first inductor portion L12A includes a first structure L12Aa and a second structure L12Ab each extending in a direction parallel to the stacking direction T, and a third structure L12Ac extending along a plane intersecting the stacking direction T. The third structure L12Ac is provided between the first structure L12Aa and the second structure L12Ab in the circuit configuration. In the present embodiment, the third structure L12Ac connects the first structure L12Aa and the second structure L12Ab.

Each of the first and second structures L12Aa and L12Ab includes at least one columnar conductor extending in a direction parallel to the stacking direction T. The columnar conductor is a structure constituted by a plurality of through holes being connected in series. As shown in FIG. 12, in the present embodiment, the first structure L12Aa includes the three columnar conductors T1a arranged with certain space from each other in a direction orthogonal to the stacking direction T. The three columnar conductors T1a are constituted by the plurality of through holes formed in the dielectric layers 54 to 71 and denoted by the reference numeral T1a.

As shown in FIG. 12, in the present embodiment, the second structure L12Ab includes the three columnar conductors T1b arranged with certain space from each other in a direction orthogonal to the stacking direction T. The three columnar conductors T1b are constituted by the plurality of through holes formed in the dielectric layers 54 to 71 and denoted by the reference numeral T1b.

As shown in FIG. 12, the third structure L12Ac includes the conductor layers 723 and 733 stacked together in the stacking direction T and electrically connected to each other. The area of the conductor layer 723 is larger than the area of the conductor layer 733. The conductor layer 733 is arranged inside an outer edge of the conductor layer 723 when viewed in the stacking direction T. The shape of the conductor layer 733 when viewed in the stacking direction T is similar to the shape of the conductor layer 723 when viewed in the stacking direction T.

The conductor structure of the second inductor portion L12B is also a rectangular or approximately rectangular winding. The number of windings of the conductor structure of the second inductor portion L12B is ¾. Since the second inductor portion L12B is connected in parallel with the first inductor portion L12A, the substantial number of windings of the inductor L12 is ¾.

The conductor structure of the second inductor portion L12B includes a first structure L12Ba and a second structure L12Bb each extending in a direction parallel to the stacking direction T and a third structure L12Bc extending along a plane intersecting the stacking direction T. The third structure L12Bc is provided between the first structure L12Ba and the second structure L12Bb in the circuit configuration. In the present embodiment, the third structure L12Bc connects the first structure L12Ba and the second structure L12Bb.

Each of the first and second structures L12Ba and L12Bb includes at least one columnar conductor extending in a direction parallel to the stacking direction T. As shown in FIG. 12, in the present embodiment, the first structure L12Ba includes the two columnar conductors T2a arranged with certain space from each other in a direction orthogonal to the stacking direction T. The two columnar conductors T2a are constituted by the plurality of through holes formed in the dielectric layers 54 to 71 and denoted by the reference numeral T2a.

As shown in FIG. 12, in the present embodiment, the second structure L12Bb includes the two columnar conductors T2b arranged with certain space from each other in a direction orthogonal to the stacking direction T. The two columnar conductors T2b are constituted by the plurality of through holes formed in the dielectric layers 54 to 71 and denoted by the reference numeral T2b.

As shown in FIG. 12, the third structure L12Bc includes the conductor layers 724 and 734 stacked together in the stacking direction T and electrically connected to each other. The area of the conductor layer 724 is larger than the area of the conductor layer 734. The conductor layer 734 is arranged inside an outer edge of the conductor layer 724 when viewed in the stacking direction T. The shape of the conductor layer 734 when viewed in the stacking direction T is similar to the shape of the conductor layer 724 when viewed in the stacking direction T.

Next, the first to third structures of the inductor L22 will be described. As shown in FIG. 9 to FIG. 11 and FIG. 13, the inductor L22 includes a first inductor portion L22A and a second inductor portion L22B connected in parallel with the first inductor portion L22A. Each of the first and second inductor portions L22A and L22B includes a conductor structure wound about the second axis A2.

The configuration of the conductor structure of the first inductor portion L22A is basically the same as the configuration of the conductor structure of the first inductor portion L12A. By replacing the first inductor portion L12A, the first structure L12Aa, the second structure L12Ab, the third structure L12Ac, the conductor layers 723 and 733, the reference numerals T1a and T1b, and FIG. 12 in the description of the configuration of the conductor structure of the first inductor portion L12A respectively with the first inductor portion L22A, a first structure L22Aa, a second structure L22Ab, a third structure L22Ac, the conductor layers 726 and 736, the reference numerals T3*a* and T3*b*, and FIG. 13, this serves as description of the configuration of the conductor structure of the first inductor portion L22A except for the following respect. In the conductor structure of the first inductor portion L22A, the three columnar conductors T3*b* are constituted by the plurality of through holes formed in the dielectric layers 56 to 71 and denoted by the reference numeral T3*b*.

The configuration of the conductor structure of the second inductor portion L22B is basically the same as the configuration of the conductor structure of the second inductor portion L12B. By replacing the second inductor portion L12B, the first structure L12Ba, the second structure L12Bb, the third structure L12Bc, the conductor layers 724 and 734, the reference numerals T2*a* and T2*b*, and FIG. 12 in the description of the configuration of the conductor structure of the second inductor portion L12B respectively with the second inductor portion L22B, a first structure L22Ba, a second structure L22Bb, a third structure L22Bc, the conductor layers 727 and 737, the reference numerals T4*a* and T4*b*, and FIG. 13, this serves as description of the configuration of the conductor structure of the second inductor portion L22B except for the following respect. In the conductor structure of the second inductor portion L22B, the two columnar conductors T4*b* are constituted by the plurality of through holes formed in the dielectric layers 56 to 71 and denoted by the reference numeral T4*b*.

Next, structural features related to the columnar conductors included in the inductors L12 and L22 will be described. In the present embodiment, the number of the columnar conductors in the first inductor portion L12A is six, and the number of the columnar conductors in the second inductor portion L12B is four. Hence, in the present embodiment, the number of the columnar conductors in the first inductor portion L12A is larger than the number of the columnar conductors in the second inductor portion L12B. However, the numbers of columnar conductors included in the first and second inductor portions L12A and L12B are not limited to the above-described examples. For example, the number of columnar conductors in the first inductor portion L12A and the number of the columnar conductors in the second inductor portion L12B may be the same. The number of columnar conductors in the second inductor portion L12B may be two. In other words, the first structure L12Ba of the second inductor portion L12B may be constituted by one columnar conductor T2*a*, and the second structure L12Bb of the second inductor portion L12B may be constituted by one columnar conductor T2*b*.

The three columnar conductors T1*a* in the first structure L12Aa of the first inductor portion L12A are arranged in a direction orthogonal to the stacking direction T. Similarly, the three columnar conductors T1*b* in the second structure L12Ab of the first inductor portion L12A are arranged in a direction orthogonal to the stacking direction T. In particular, in the present embodiment, the above-described direction is a short-side direction of the third structure L12Ac of the first inductor portion L12A, in other words, a direction parallel to the Y direction. Note that at least one of the first structure L12Aa and the second structure L12Ab may include a plurality of columnar conductors arranged in a direction intersecting the short-side direction of the third structure L12Ac (direction parallel to the Y direction), instead of the above-described columnar conductors or in addition to the above-described columnar conductors.

The two columnar conductors T2*a* in the first structure L12Ba of the second inductor portion L12B are arranged in a direction orthogonal to the stacking direction T. Similarly, the two columnar conductors T2*b* in the second structure L12Bb of the second inductor portion L12B are arranged in a direction orthogonal to the stacking direction T. In particular, in the present embodiment, the above-described direction is a short-side direction of the third structure L12Bc of the second inductor portion L12B, in other words, a direction parallel to the Y direction. Note that at least one of the first structure L12Ba and the second structure L12Bb may include a plurality of columnar conductors arranged in a direction intersecting the short-side direction of the third structure L12Bc (direction parallel to the Y direction), instead of the above-described columnar conductors or in addition to the above-described columnar conductors.

In the present embodiment, the three columnar conductors T1*a* and the two columnar conductors T2*a* are arranged in a direction orthogonal to the stacking direction T. Similarly, the three columnar conductors T1*b* and the two columnar conductors T2*b* are arranged in a direction orthogonal to the stacking direction T. In particular, in the present embodiment, the above-described direction is a direction parallel to the Y direction.

The above descriptions about the columnar conductors in the first and second inductor portions L12A and L12B also apply to the columnar conductors in the first and second inductor portions L22A and L22B.

Next, structural features related to the third structures L12Ac, L12Bc, L22Ac, and L22Bc will be described. The third structures L12Ac, L12Bc, L22Ac, and L22Bc are arranged at the same position in the stacking direction T. Specifically, the conductor layer 723 of the third structure L12Ac, the conductor layer 724 of the third structure L12Bc, the conductor layer 726 of the third structure L22Ac, and the conductor layer 727 of the third structure L22Bc are arranged at the same position in the stacking direction T, and also the conductor layer 733 of the third structure L12Ac, the conductor layer 734 of the third structure L12Bc, the conductor layer 736 of the third structure L22Ac, and the conductor layer 737 of the third structure L22Bc are arranged at the same position in the stacking direction T.

The short-side-direction size of the third structure L12Ac is the same as the short-side-direction size of the conductor layer 723, and the short-side-direction size of the third structure L12Bc is the same as the short-side-direction size of the conductor layer 724. In the present embodiment, the short-side-direction size of the conductor layer 723 is larger than the short-side-direction size of the conductor layer 724. Hence, the short-side-direction size of the third structure L12Ac is larger than the short-side-direction size of the third structure L12Bc.

The short-side-direction size of the third structure L22Ac is the same as the short-side-direction size of the conductor layer 726, and the short-side-direction size of the third structure L22Bc is the same as the short-side-direction size of the conductor layer 727. In the present embodiment, the short-side-direction size of the conductor layer 726 is larger than the short-side-direction size of the conductor layer 727. Hence, the short-side-direction size of the third structure L22Ac is larger than the short-side-direction size of the third structure L22Bc.

Next, structural features of the capacitor C12 connected in parallel with the inductor L12 and the capacitor C24 connected in parallel with the inductor L22 will be described. As described above, the capacitor C12 is constituted by the conductor layers 542 and 551 and the dielectric layer 54 interposed between those conductor layers. The capacitor C24 is constituted by the conductor layers 544 and 554 and the dielectric layer 54 interposed between those conductor layers. The conductor layer 542 of the capacitor C12 and the conductor layer 544 of the capacitor C24 are arranged at the same position in the stacking direction T. The conductor layer 551 of the capacitor C12 and the conductor layer 554 of the capacitor C24 are arranged at the same position in the stacking direction T.

Next, structural features related to the inductor L10 will be described. The inductor L10 is wound about an axis extending in a direction orthogonal to the stacking direction T. In particular, in the present embodiment, the inductor L10 is a conductor structure type inductor wound about an axis parallel to the X direction. The number of windings of the inductor L10 is 7/4.

As shown in FIG. 10, the inductor L10 is arranged between the inductor L12 and the side surface 50E and is also arranged between the inductor L22 and the side surface 50D.

Figure 14:
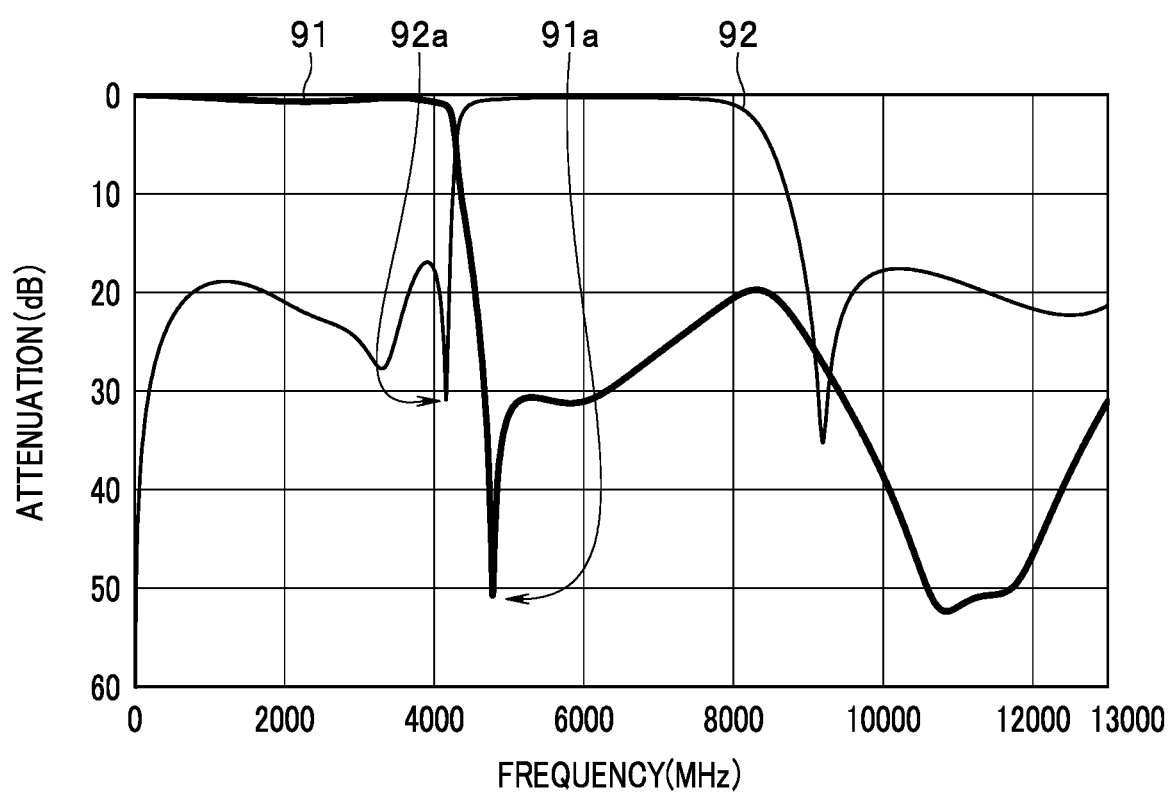
FIG. 14 is a characteristic chart showing pass attenuation characteristics of the branching filter according to the embodiment of the present invention.

Next, an example of characteristics of the branching filter 1 according to the present embodiment will be described. FIG. 14 is a characteristic chart showing the pass attenuation characteristics of the branching filter 1. In FIG. 14, the horizontal axis indicates frequency, and the vertical axis indicates the attenuation. In FIG. 14, a reference numeral 91 indicates the pass attenuation characteristics between the common terminal 2 and the first signal terminal 3. A reference numeral 92 indicates the pass attenuation characteristics between the common terminal 2 and the second signal terminal 4.

The pass attenuation characteristics denoted by the reference numeral 91 substantially shows the pass attenuation characteristics of the first filter 10. In the pass attenuation characteristics denoted by the reference numeral 91, the frequency region in which the absolute value of attenuation takes a value close to 0 indicates the first passband of the first filter 10. The pass attenuation characteristics denoted by the reference numeral 92 substantially shows the pass attenuation characteristics of the second filter 20. In the pass attenuation characteristics denoted by the reference numeral 92, the frequency region in which the absolute value of attenuation takes a value close to 0 indicates the second passband of the second filter 20. FIG. 14 shows the characteristics of the branching filter 1 when a design is made so that the first passband of the first filter 10 includes a frequency band of 3800 MHz to 4200 MHz and the second passband of the second filter 20 includes a frequency band of 4400 MHz to 7125 MHz.

In FIG. 14, an arrow denoted by a reference numeral 91a indicates an attenuation pole formed by the inductor L12 and the capacitor C12. As shown in FIG. 14, no other attenuation pole is formed in the frequency region between the attenuation pole 91a and the first passband. In other words, in the pass attenuation characteristics of the first filter 10, the attenuation pole 91a is an attenuation pole closest to the first passband in a frequency region higher than the first passband.

In FIG. 14, an arrow denoted by a reference numeral 92a indicates an attenuation pole formed by the inductor L22 and the capacitor C24. As shown in FIG. 14, no other attenuation pole is formed in the frequency region between the attenuation pole 92a and the second passband. In other words, in the pass attenuation characteristics of the second filter 20, the attenuation pole 92a is an attenuation pole closest to the second passband in a frequency region lower than the second passband.

Now, the operation and effects of the branching filter 1 according to the present embodiment will be described. In the present embodiment, the second filter 20 includes an inductor L22 connected, at both ends thereof, to the second path 6. In the example of the characteristics of the branching filter 1 shown in FIG. 14, the upper limit frequency of the first passband is 4200 MHz, and the lower limit frequency of the second passband is 4400 MHz. In this example, the difference between the upper limit frequency of the first passband and the lower limit frequency of the second passband is only 200 MHz. The branching filter 1 required to have such characteristics requires to have characteristics of an abrupt change of the absolute value of attenuation, in other words, insertion loss, in a frequency region lower than the second passband of the second filter 20. As understood from FIG. 14, according to the present embodiment, by the attenuation pole 92a formed by the inductor L22, the characteristics of an abrupt change of insertion loss in a frequency region lower than the second passband of the second filter 20 can be provided.

Moreover, as understood from FIG. 14, in the present embodiment, the inductor L12 forms the attenuation pole 91a in a frequency region near the first passband of the first filter 10 and higher than the first passband of the first filter 10 in the pass attenuation characteristics of the first filter 10. In the present embodiment, the inductor L12 is a conductor structure type inductor.

Here, it is considered to use, as the inductor L22, a conductor layer type inductor constituted by one or more conductor layers wound about an axis parallel to the stacking direction T. In the process of manufacturing the branching filter 1, at the time of stacking the plurality of ceramic green sheets, which eventually become a plurality of dielectric layers, the plurality of ceramic green sheets are slightly displaced in some cases. The characteristics of an inductor change due to such manufacturing variations. The characteristics of a conductor structure type inductor change in a manner different from that of the conductor layer type inductor. Hence, by using a conductor layer type inductor as the inductor L22, the characteristics of the inductor L22 change in a manner different from that of the inductor L12. Consequently, the attenuation pole 92a changes in a manner different from that of the attenuation pole 91a.

When the attenuation poles 91a and 92a change, the first passband and the second passband also change. For example, when the first passband and the second passband change so that a frequency region higher than the first passband and lower than the second passband becomes narrow, signals supposed to be separated by the first and second filters 10 and 20 fail to be separated in some cases.

In contrast to this, in the present embodiment, the same conductor structure type inductor as the inductor L12 is used as the inductor L22. Thus, according to the present embodiment, it is possible to bring the mode of a change of the inductor L22 attributable to manufacturing variations closer to the mode of a change of the inductor L12. Consequently, according to the present embodiment, it is possible to suppress a change of the second passband relative to the first passband.

Meanwhile, when the size of the stack 50 is small, interaction such as electromagnetic coupling occurs between the inductor L12 and the inductor L22. If the inductor L12 and the inductor L22 are arranged in line, the above-described interaction is large. In this case, if the positional relationship between the inductor L12 and the inductor L22 changes due to manufacturing variations, the above-described interaction also changes. In contrast to this, in the present embodiment, the inductor L12 is arranged at a position closer to the first end portion E1 of the stack 50 than to the second end portion E2 of the stack 50, and the inductor L22 is arranged at a position closer to the second end portion E2 of the stack 50 than to the first end portion E1 of the stack 50. With this, according to the present embodiment, it is possible to reduce interaction between the inductor L12 and the inductor L22 and also to suppress a change of interaction attributable to manufacturing variations, compared to a case where the inductors L12 and L22 are arranged in line.

Thus, according to the present embodiment, it is possible to suppress a change in characteristics attributable to manufacturing variation while providing characteristics of an abrupt change of insertion loss in a frequency region near the second passband of the second filter 20 and lower than the second passband of the second filter 20.

In the present embodiment, since the inductors L12 and L22 are both conductor structure type inductors, the Q values of the inductors L12 and L22 can be large.

Note that the inductors L12 and L22 are designed so that the inductance of the inductor L12 and the inductance of the inductor L22 take values relatively close to each other. For example, the inductance of the inductor L22 may be within a range of 75% to 125% of the inductance of the inductor L12.

In the present embodiment, the third structure L12Ac of the first inductor portion L12A of the inductor L12 includes the two conductor layers 723 and 733. The area of the conductor layer 723 is larger than the area of the conductor layer 733. Thus, even if the conductor layer 733 is displaced relative to the conductor layer 723 but a displacement amount is smaller than a certain amount, the conductor layer 733 does not extend out of the conductor layer 723 when viewed in the stacking direction T. Thus, according to the present embodiment, it is possible to suppress characteristic variations of the first inductor portion L12A attributable to mutual displacement of the conductor layer 723 and the conductor layer 733.

The above description of the first inductor portion L12A also applies to the second inductor portion L12B of the inductor L12, the first inductor portion L22A of the inductor L22, and the second inductor portion L22B of the inductor L22.

In the present embodiment, the third structures L12Ac, L12Bc, L22Ac, and L22Bc are arranged at the same position in the stacking direction T. With this, according to the present embodiment, it is possible to bring the modes of changes of the inductors L12 and L22 to be similar to each other even when manufacturing variations that make a displacement amount different for each ceramic green sheet occur.

In the present embodiment, the capacitor C12 is connected in parallel with the inductor L12, and the capacitor C24 is connected in parallel with the inductor L22. The conductor layer 542 of the capacitor C12 and the conductor layer 544 of the capacitor C24 are arranged at the same position in the stacking direction T. The conductor layer 551 of the capacitor C12 and the conductor layer 554 of the capacitor C24 are arranged at the same position in the stacking direction T. With this, according to the present embodiment, it is possible to bring the modes of changes of capacitors C12 and C24 to be similar to each other even when manufacturing variations that make a displacement amount different for each ceramic green sheet occur. Consequently, according to the present embodiment, it is possible to bring the modes of changes of the attenuation pole 91a formed by the inductor L12 and the capacitor C12 and the attenuation pole 92a formed by the inductor L22 and the capacitor C24, similar to each other.

In the present embodiment, the inductor L10 is substantially a conductor structure type inductor. Thus, according to the present embodiment, it is possible to increase the Q value of the inductor L10.

The present invention is not limited to the foregoing embodiment, and various modifications may be made thereto. For example, the configuration of each of the first and second filters 10 and 20 in the present invention is not limited to the examples described in the embodiment and may be optional as long as the requirements set forth in the claims are met.

The arrangement and posture of each of the inductors L12 and L22 are not limited to the examples described in the embodiment and may be optional as long as the requirements set forth in the claims are met. For example, at least one of the first and second axes A1 and A2 may extend in a direction intersecting a direction parallel to the Y direction.

The number of the windings of each of the inductors L12 and L22 is not limited to ¾ and may be any number of windings equal to or larger than one. The inductor L12 may include only at least one of the first and second inductor portions L12A and L12B. Similarly, the inductor L22 may include only at least one of the first and second inductor portions L22A and L22B.

As described above, a branching filter of the present invention includes a common terminal, a first signal terminal, a second signal terminal, a first filter, which is provided between the common terminal and the first signal terminal in a circuit configuration, that selectively passes a signal of a frequency within a first passband, a second filter, which is provided between the common terminal and the second signal terminal in the circuit configuration, that selectively passes a signal within a second passband higher than the first passband, and a stack, which is for integrating the common terminal, the first signal terminal, the second signal terminal, the first filter, and the second filter, that includes a plurality of dielectric layers stacked together.

Each of the first filter and the second filter is an LC filter including at least one inductor and at least one capacitor. The first filter includes a first inductor connected, at both ends of the first inductor, to a first path connecting the common terminal and the first signal terminal. The second filter includes a second inductor connected, at both ends of the second inductor, to a second path connecting the common terminal and the second signal terminal. Each of the first inductor and the second inductor is wound about an axis extending in a direction orthogonal to a stacking direction of the plurality of dielectric layers.

The stack includes a first side surface and a second side surface located at respective both ends in a first direction orthogonal to the stacking direction, a third side surface and a fourth side surface located at respective both ends in a second direction orthogonal to the stacking direction and each connecting the first side surface and the second side surface, a first end portion located at a position where the first side surface and the third side surface intersect, and a second end portion located at a position where the second side surface and the fourth end surface intersect. The first inductor is arranged at a position closer to the first end portion than to the second end portion. The second inductor is arranged at a position closer to the second end portion than to the first end portion.

In the branching filter of the present invention, the first inductor may be wound about a first axis. The second inductor may be wound about a second axis. The first axis and the second axis may be parallel to each other.

In the branching filter of the present invention, the number of windings of each of the first inductor and the second inductor may be ¾ or more.

In the branching filter of the present invention, each of the first inductor and the second inductor may include a first structure and a second structure each extending in a direction parallel to the stacking direction and a third structure extending along a plane intersecting the stacking direction and provided between the first structure and the second structure in the circuit configuration. The third structure of the first inductor and the third structure of the second inductor may be arranged at the same position in the stacking direction. The third structure may include a plurality of conductor layers stacked together in the stacking direction and electrically connected to each other.

When each of the first inductor and the second inductor includes the first to third structures, the first filter may further include a first capacitor connected in parallel with the first inductor, and the second filter may further include a second capacitor connected in parallel with the second inductor. Each of the first capacitor and the second capacitor may include a first conductor layer and a second conductor layer arranged with space from each other in the stacking direction. The first conductor layer of the first capacitor and the first conductor layer of the second capacitor may be arranged at the same position in the stacking direction. The second conductor layer of the first capacitor and the second conductor layer of the second capacitor may be arranged at the same position in the stacking direction. In the pass attenuation characteristics of the first filter, in a frequency region between a first attenuation pole formed by the first inductor and the first capacitor and the first passband, no other attenuation pole may be formed. In the pass attenuation characteristics of the second filter, in a frequency region between a second attenuation pole formed by the second inductor and the second capacitor and the second passband, no other attenuation pole may be formed.

In the branching filter of the present invention, the second filter may further include a third inductor provided between the second path and a ground.

The branching filter of the present invention may further include a third inductor provided between the common terminal, and the first filter and the second filter in the circuit configuration, and wound about an axis extending in a direction orthogonal to the stacking direction.

Obviously, many modifications and variations of the present invention are possible in the light of the above teachings. Thus, it is to be understood that, within the scope of the appended claims and equivalents thereof, the present invention may be practiced in other embodiments than the foregoing most preferable embodiment.

What is claimed is:

1. A branching filter comprising:
a common terminal;
a first signal terminal:
a second signal terminal;
a first filter, which is provided between the common terminal and the first signal terminal in a circuit configuration, that selectively passes a signal of a frequency within a first passband;
a second filter, which is provided between the common terminal and the second signal terminal in the circuit configuration, that selectively passes a signal within a second passband higher than the first passband; and
a stack, which is for integrating the common terminal, the first signal terminal, the second signal terminal, the first filter, and the second filter, that includes a plurality of dielectric layers stacked together, wherein each of the first filter and the second filter is an LC filter including at least one inductor and at least one capacitor, the first filter includes a first inductor connected, at two ends of the first inductor, to a first path connecting the common terminal and the first signal terminal, the second filter includes a second inductor connected, at two ends of the second inductor, to a second path connecting the common terminal and the second signal terminal, each of the first inductor and the second inductor is wound about an axis extending in a direction orthogonal to a stacking direction of the plurality of dielectric layers, the stack includes a first side surface and a second side surface located at respective two ends in a first direction orthogonal to the stacking direction, a third side surface and a fourth side surface located at respective two ends in a second direction orthogonal to the stacking direction and each connecting the first side surface and the second side surface, a first end portion located at a position where the first side surface and the third side surface intersect, and a second end portion located at a position where the second side surface and the fourth end surface intersect, the first inductor is arranged at a position closer to the first end portion than to the second end portion, the second inductor is arranged at a position closer to the second end portion than to the first end portion, and the branching filter further includes a third inductor provided between the common terminal, and the first filter and the second filter in the circuit configuration, and wound about an axis extending in a direction orthogonal to the stacking direction.

2. A branching filter comprising:
a common terminal;
a first signal terminal:
a second signal terminal;
a first filter, which is provided between the common terminal and the first signal terminal in a circuit configuration, that selectively passes a signal of a frequency within a first passband;
a second filter, which is provided between the common terminal and the second signal terminal in the circuit configuration, that selectively passes a signal within a second passband higher than the first passband; and
a stack, which is for integrating the common terminal, the first signal terminal, the second signal terminal, the first filter, and the second filter, that includes a plurality of dielectric layers stacked together, wherein each of the first filter and the second filter is an LC filter including at least one inductor and at least one capacitor, the first filter includes a first inductor connected, at two ends of the first inductor, to a first path connecting the common terminal and the first signal terminal, the second filter includes a second inductor connected, at two ends of the second inductor, to a second path connecting the common terminal and the second signal terminal, each of the first inductor and the second inductor is wound about an axis extending in a direction orthogonal to a stacking direction of the plurality of dielectric layers, the stack includes a first side surface and a second side surface located at respective two ends in a first direction orthogonal to the stacking direction, a third side surface and a fourth side surface located at respective two ends in a second direction orthogonal to the stacking direction and each connecting the first side surface and the second side surface, a first end portion located at a position where the first side surface and the third side surface intersect, and a second end portion located at a position where the second side surface and the fourth end surface intersect, the first inductor is arranged at a position closer to the first end portion than to the second end portion, the second inductor is arranged at a position closer to the second end portion than to the first end portion, the first inductor is wound about a first axis, the second inductor is wound about a second axis, and the first axis and the second axis are parallel to each other.

3. The branching filter according to claim 2, wherein the number of windings of each of the first inductor and the second inductor is ¾ or more.

4. The branching filter according to claim 2, wherein each of the first inductor and the second inductor includes a first structure and a second structure each extending in a direction parallel to the stacking direction and a third structure extending along a plane intersecting the stacking direction and provided between the first structure and the second structure in the circuit configuration.

5. The branching filter according to claim 4, wherein the third structure of the first inductor and the third structure of the second inductor are arranged at a same position in the stacking direction.

6. The branching filter according to claim 4, wherein the third structure includes a plurality of conductor layers stacked together in the stacking direction and electrically connected to each other.

7. The branching filter according to claim 4, wherein the first filter further includes a first capacitor connected in parallel with the first inductor, and the second filter further includes a second capacitor connected in parallel with the second inductor.

8. The branching filter according to claim 7, wherein each of the first capacitor and the second capacitor includes a first conductor layer and a second conductor layer arranged with space from each other in the stacking direction, the first conductor layer of the first capacitor and the first conductor layer of the second capacitor are arranged at a same position in the stacking direction, and the second conductor layer of the first capacitor and the second conductor layer of the second capacitor are arranged at a same position in the stacking direction.

9. The branching filter according to claim 7, wherein in pass attenuation characteristics of the first filter, in a frequency region between a first attenuation pole formed by the first inductor and the first capacitor and the first passband, no other attenuation pole is formed, and in pass attenuation characteristics of the second filter, in a frequency region between a second attenuation pole formed by the second inductor and the second capacitor and the second passband, no other attenuation pole is formed.

10. The branching filter according to claim 2, wherein the second filter further includes a third inductor provided between the second path and a ground.

11. The branching filter according to claim 2, further comprising a third inductor provided between the common terminal, and the first filter and the second filter in the circuit configuration, and wound about an axis extending in a direction orthogonal to the stacking direction.

12. A branching filter comprising:

a common terminal;

a first signal terminal:

a second signal terminal;

a first filter, which is provided between the common terminal and the first signal terminal in a circuit configuration, that selectively passes a signal of a frequency within a first passband;

a second filter, which is provided between the common terminal and the second signal terminal in the circuit configuration, that selectively passes a signal within a second passband higher than the first passband; and a stack, which is for integrating the common terminal, the first signal terminal, the second signal terminal, the first filter, and the second filter, that includes a plurality of dielectric layers stacked together, wherein each of the first filter and the second filter is an LC filter including at least one inductor and at least one capacitor, the first filter includes a first inductor connected, at two ends of the first inductor, to a first path connecting the common terminal and the first signal terminal, the second filter includes a second inductor connected, at two ends of the second inductor, to a second path connecting the common terminal and the second signal terminal, each of the first inductor and the second inductor is wound about an axis extending in a direction orthogonal to a stacking direction of the plurality of dielectric layers, the stack includes a first side surface and a second side surface located at respective two ends in a first direction orthogonal to the stacking direction, a third side surface and a fourth side surface located at respective two ends in a second direction orthogonal to the stacking direction and each connecting the first side surface and the second side surface, a first end portion located at a position where the first side surface and the third side surface intersect, and a second end portion located at a position where the second side surface and the fourth end surface intersect, the first inductor is arranged at a position closer to the first end portion than to the second end portion, the second inductor is arranged at a position closer to the second end portion than to the first end portion, and the number of windings of each of the first inductor and the second inductor is ¾ or more.

\* \* \* \* \*